United States Patent

Moslehi et al.

[11] Patent Number: 5,976,261
[45] Date of Patent: Nov. 2, 1999

[54] MULTI-ZONE GAS INJECTION APPARATUS AND METHOD FOR MICROELECTRONICS MANUFACTURING EQUIPMENT

[75] Inventors: Mehrdad M. Moslehi, Los Altos; Yong Jin Lee, San Jose; Ahmad Kermani, Danville, all of Calif.

[73] Assignee: CVC Products, Inc., Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/678,297

[22] Filed: Jul. 11, 1996

[51] Int. Cl.$^6$ .................................................. C23C 16/00
[52] U.S. Cl. ............. 118/719; 118/723 R; 118/723 MP; 118/723 E; 427/248.1; 427/255.1; 427/569
[58] Field of Search .................... 427/248.1, 255, 427/255.1, 255.6, 569; 118/715, 719, 723 R, 723 MP, 723 E, 724; 204/192.13, 192.32, 298.07

[56] References Cited

U.S. PATENT DOCUMENTS

| | | | |
|---|---|---|---|
| 4,369,031 | 1/1983 | Goldman et al. | 118/715 |
| 4,756,272 | 7/1988 | Kessler et al. | 118/715 |
| 4,993,358 | 2/1991 | Mahawili . | |
| 5,252,178 | 10/1993 | Moslehi | 118/723 E |
| 5,411,590 | 5/1995 | Hawkins et al. | 118/715 |
| 5,453,124 | 9/1995 | Moslehi et al. | 118/715 |
| 5,464,499 | 11/1995 | Moslehi et al. . | |
| 5,540,777 | 7/1996 | Barbee et al. | 118/719 |

*Primary Examiner*—Shrive Beck
*Assistant Examiner*—Bret Chen
*Attorney, Agent, or Firm*—Gray Cary Ware & Freidenrich, LLP

[57] ABSTRACT

A method and apparatus for multi-zone injection apparatus of multiple process gases onto a work piece during manufacture. The multi-zone injection apparatus uses a gas injection plate with multiple injection zones to deliver the multiple process gases into the chamber for deposition onto the work piece (for example, a silicon wafer). The gas showerhead separates the multiple process in a manner that avoids premixing the process gases, thereby minimizing gas-phase nucleation and particulate generation. The showerhead also allows real-time independent control over the gas flow rates in N channels to achieve deposition uniformity. Different gases can be configured in adjacent channels to provide M zones of multi-gas radial control.

42 Claims, 7 Drawing Sheets

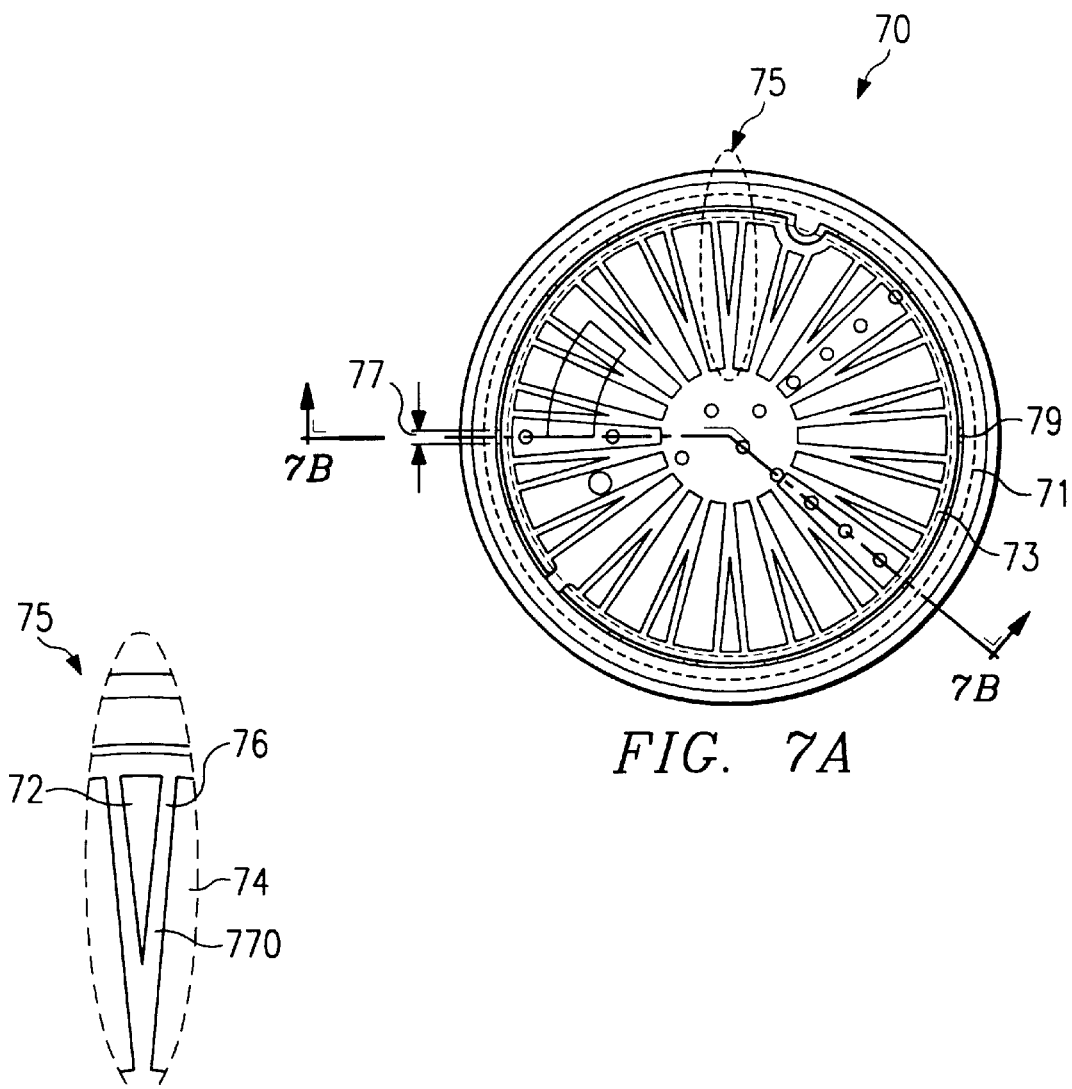
FIG. 7A
FIG. 7C
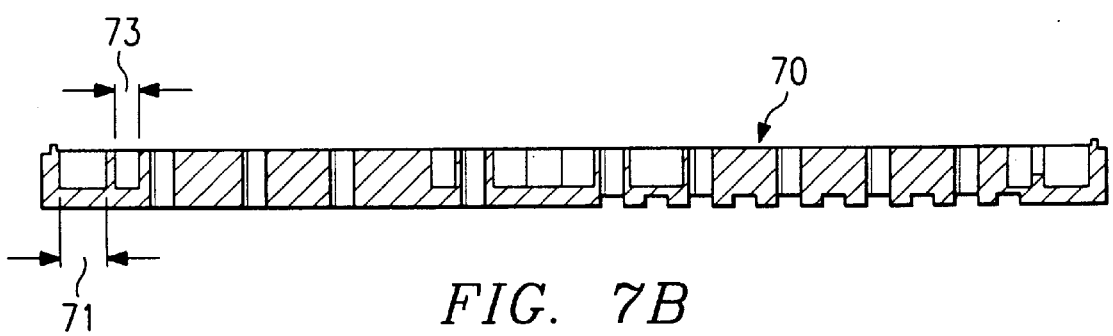
FIG. 7B

MULTI-ZONE GAS INJECTION APPARATUS AND METHOD FOR MICROELECTRONICS MANUFACTURING EQUIPMENT

TECHNICAL FIELD OF THE INVENTION

This invention relates in general to the field of microelectronics manufacturing equipment, and more particularly to a programmable multi-zone gas/vapor injection apparatus and method for semiconductor device fabrication systems.

BACKGROUND OF THE INVENTION

Most semiconductor fabrication systems, particularly thermal and plasma chemical-vapor deposition (CVD) reactors, must provide good process uniformity (including temperature uniformity, reactant species uniformity, deposition uniformity, and mass transport uniformity) when performing substrate processing. Conventional CVD systems typically use single-zone showerheads (or rings) in order to inject the process gases/vapor into the process chamber for wafer processing.

In a conventional showerhead design, the injector plate has an array of holes operating to inject a single gas or a combination of process gases into a deposition chamber or process environment in an attempt to provide a uniform mass transport of reactant flux to the wafer or substrate. These conventional showerhead designs can be referred to as single-zone showerheads because these "single-zone" showerheads only control flow of process gases through the showerhead (i.e., within one zone equal to the showerhead itself), without any multi-zone spatial control over the gas flow distribution uniformity over the substrate.

Such conventional single-zone injectors experience problems meeting the process uniformity and cleanliness requirements for various deposition processes due to the problems associated with pre-mixing and gaseous phase reaction of the process gases and also due to lack of multi-zone control over the mass-transport uniformity profile. Typically CVD systems use multiple process gases to deposit a film onto a work piece. The multiple gases may consist of a combination of a precursor gas or vaporized liquid and a carrier gas or multireactant gases. In conventional single-zone showerhead designs, the multiple gases are premixed within the showerhead assembly or prior to delivery to the showerhead assembly before injection into the process chamber. The process of premixing multiple gases can result in gas-phase nucleation which can, in turn, result in generation of particulates and process contamination causing manufacturing yield degradation. Particulate generation represents a serious problem because CVD applications require a clean environment.

These prior art designs are also limited because the single-zone designs do not provide a capability for spatial control of the reactant species concentration (mass transport uniformity) profile. The non-uniformity in the reactant species concentration over the wafer will result in non-uniform film thickness and/or quality.

Another limitation in conventional showerhead designs is the lack of the ability to clean the showerhead surface in-situ, without opening up the chamber.

SUMMARY OF THE INVENTION

In accordance with the present invention, a multi-zone injection apparatus and method for microelectronics manufacturing equipment is provided that substantially eliminates or minimizes the disadvantages and problems associated with previously developed process gas delivery and injection systems.

More specifically, a multi-zone showerhead apparatus is provided for injecting multiple process gases into a process chamber and onto a substrate during a device fabrication process. The multi-zone injection apparatus uses a gas showerhead with multiple spatially resolved injection zones to deposit multiple process gases onto the work piece (for example, a silicon wafer). The gas showerhead separately delivers the multiple process gases in a manner that avoids premixing the process gases, thereby minimizing gas-phase nucleation and particulate generation. The programmable showerhead of the present invention is a generic design for a wide range of thermal processing applications regarding precise gas flow control including chemical-vapor deposition (CVD), rapid thermal processing (RTP), metal-organic chemical-vapor deposition (MOCVD), and plasma-enhanced chemical-vapor deposition (PECVD).

An important technical advantage of the present invention is the elimination of premixing of the process gases and/or precursor vapors to greatly reduce or eliminate gas-phase nucleation. This, in turn, reduces particulate generation in the process chamber, which is essential for enhanced process cleanliness.

Another technical advantage of the present invention is that it provides capability for spatially-resolved multi-zone control of the mass transfer deposition uniformity profile.

The present invention provides another technical advantage because it provides temperature control capability from temperatures below room temperature to greater than 300 degrees Celsius.

The gas showerhead of the present invention also provides the capability to perform in-situ process chamber cleaning after a chemical-vapor deposition process. If material deposition occurs on the showerhead surface or process chamber walls, the present invention can excite in-situ plasma inside the process chamber to remove these material deposits. This in-situ plasma cleaning process capability minimizes equipment downtime and enhances the overall utilization.

Yet another technical advantage of the present invention is the capability to include embedded sensors and actuators for monitoring process and wafer states and for in-situ autocalibration purposes. These sensors and actuators can provide information for intelligent process and control applications.

The present invention provides still another technical advantage by providing a programmable multi-zone gas injection showerhead for single wafer semiconductor equipment that can inject a plurality of process gases. The programmable capabilities of the present invention allow automated real-time adjustment of gas flow, which in turn allows control of the process state and wafer state during the device fabrication process.

BRIEF DESCRIPTION OF THE DRAWINGS

A more complete understanding of the present invention and advantages thereof may be acquired by reference to the following description taken in conjunction with the accompanying drawings in which like reference numbers indicate like features and wherein:

FIG. 7A shows an embodiment of a cooling plate that can be incorporated into the present invention FIG. 7B shows a side view of the cooling plate of FIG. 7A; and FIG. 7C shows an exploded view of a cooling channel of the cooling plate of FIG. 7A.

DETAILED DESCRIPTION OF THE INVENTION

Preferred embodiments of the present invention are illustrated in the FIGUREs, like numerals being used to refer to like and corresponding parts of the various drawings.

The present invention describes a programmable multi-zone showerhead for ultraclean controlled injection of multiple process gases (gases defined throughout to include process vapors) into a fabrication equipment process chamber. The programmable showerhead of the present invention can include a multi-zone control design, a biasable (RF or DC) showerhead, thermal control of the showerhead, and embedded sensors and actuators for process control applications. The present invention can be used in a variety of applications including Chemical-Vapor Deposition (CVD), Rapid Thermal Processing (RTP), Rapid Thermal Chemical-Vapor Deposition (RTCVD), Metal-Organic Chemical-Vapor Deposition (MOCVD), and Plasma-Enhanced Chemical-Vapor Deposition (PECVD) systems. The application areas include manufacturing equipment for semiconductors, data storage, photovoltaics, and flatpanel display device fabrication.

Figure 1:
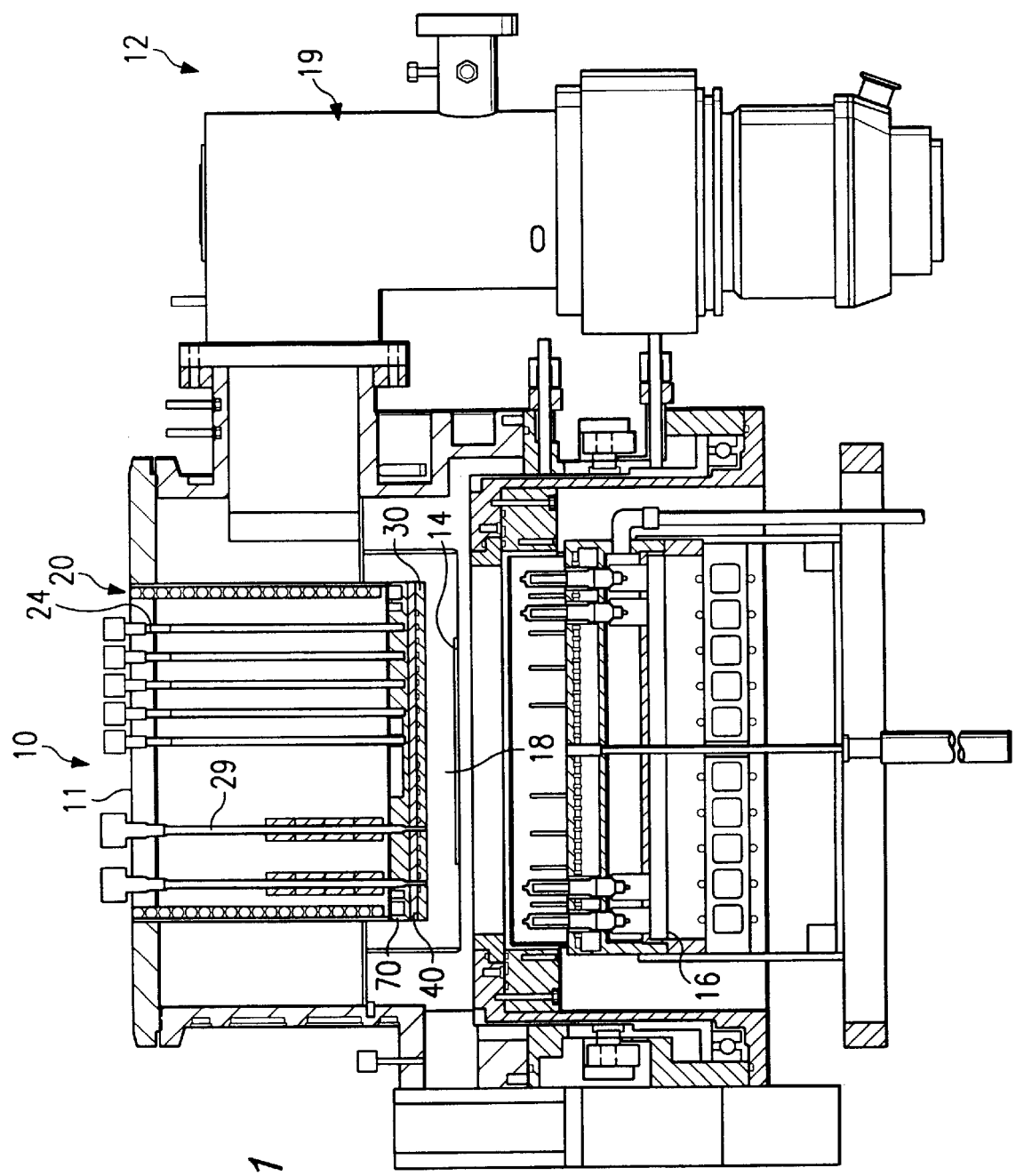
FIG. 1 illustrates a schematic diagram of a single wafer rapid thermal processing equipment including one embodiment of the present invention.

FIG. 1 shows a schematic diagram of RTP manufacturing equipment 12 including gas showerhead assembly 10 of the present invention. Gas showerhead 10 includes showerhead injection plate 30 coupled to insulator plate 40 further coupled to showerhead assembly support structure 20 (the main body of the gas showerhead apparatus 10). Gas tubes 24 feed the process gases to showerhead injection plate 30. Gas tubes 24 provide the path by which process gases enter injector plate 30 prior to injection onto a substrate 14. The gas showerhead 10 of FIG. 1 includes cooling or heating plate 70 coupled to gas showerhead assembly support structure 20 and positioned above insulator plate 40. Embedded in-situ temperature sensors 29, shown in FIG. 1 coupled to showerhead assembly 20, feed through the cooling plate 70, insulator plate 40, and showerhead injection plate 30. These embedded sensors can be actuated to measure the substrate 14 temperature at multiple points.

FIG. 1 indicates the manufacturing equipment 12 having the gas showerhead 10 of the present invention positioned above substrate 14 contained within process chamber 18. Substrate 14 can include a semiconductor substrate, and more specifically, a silicon wafer. Process manufacturing equipment 12 of FIG. 1 also includes multi-zone illuminator 16 positioned below the substrate 14 for heating wafer 14 during a device fabrication process. Process chamber 18 can provide vacuum when evacuated through vacuum pump 19 coupled to RTP fabrication equipment 12 as shown.

Figure 2B:
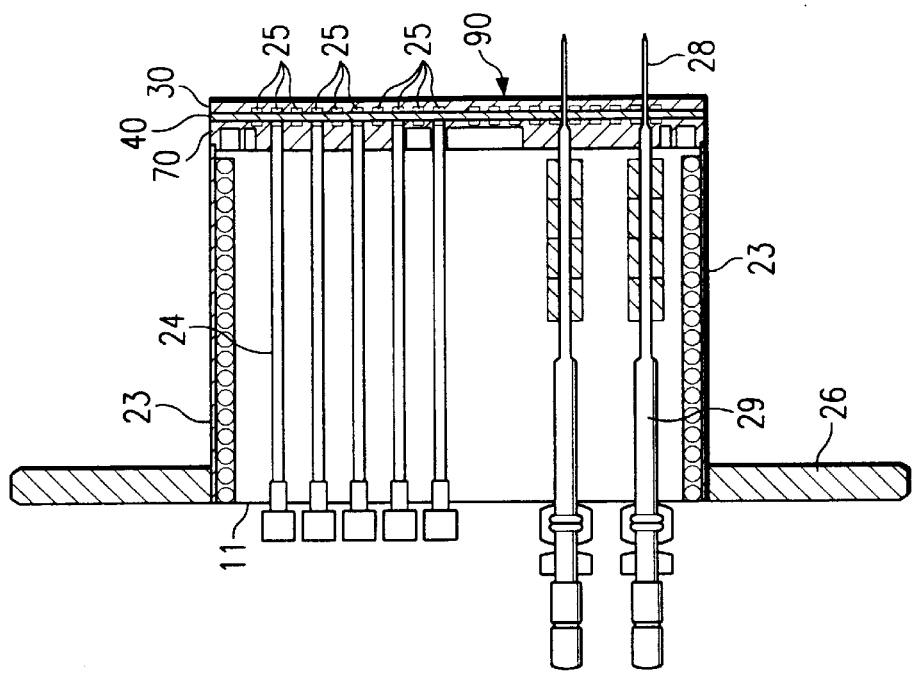
FIG. 2B illustrates a side cut-away view of the embodiment of the gas showerhead assembly of FIG. 2A.
Figure 2A:
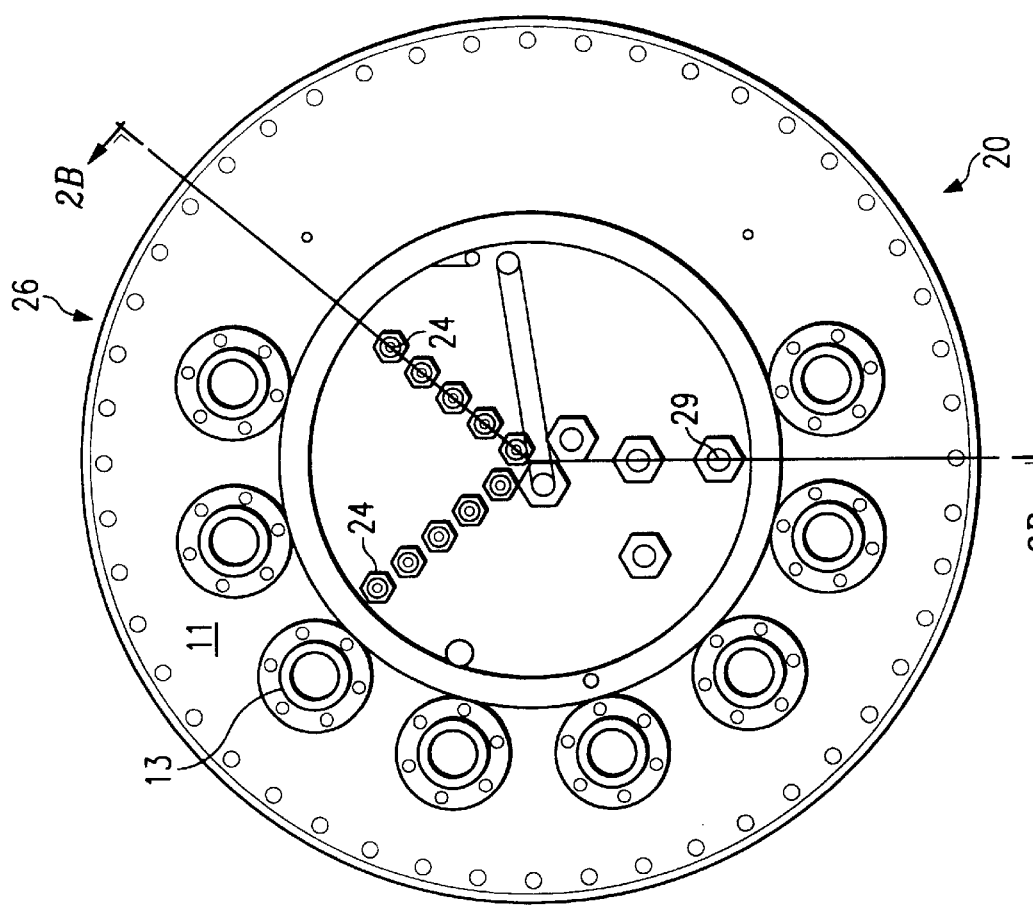
FIG. 2A illustrates a top view of one embodiment of the gas showerhead assembly.

FIG. 2A shows the top view of an embodiment of the showerhead assembly 20 including showerhead flange 26, process gas tubes 24, and embedded temperature sensor assemblies 29 for RTP sensor autocalibration applications. FIG. 2B shows a side view of the embodiment of FIG. 2A along section line 2B—2B illustrating showerhead flange 26 forming the vertical body of gas showerhead 10 coupled to the top plate 11 at the top end and coupled to cooling plate 70 at the bottom end. A heating or cooling tube 23 runs through the vertical portion of the showerhead assembly around the entire portion of the showerhead assembly 10 to provide heating or cooling to gas showerhead 10 during operation. As in FIG. 1, showerhead injection plate 30 forms the bottom portion of gas showerhead 10 and couples to insulation plate 40 and further couples to cooling plate 70 by means of screws 27 (in FIG. 2D) insulated by dielectric washers from the showerhead injection plate 30. Gas tubes 24 and embedded temperature sensors 29 feed through to showerhead injection plate 30. Gas tubes 24 are connected to gas dispersion channels 25, located on the showerhead injection plate 30 for flowing process gases from the gas tubes 24 throughout the injection plate 30 so that injection holes (not shown) associated with the injection channels 25 can discharge the process gases to the chamber 18 (in FIG. 1). In this embodiment, there is one injection channel 25 per injection tube 24. Temperature sensor assemblies 29 include thermocouples 28 positioned at the bottom of the temperature sensor assembly 29 to allow the thermocouple 28 to pass through the showerhead injection plate 30 into the process chamber 18 in FIG. 1 under automatic actuation control.

Figure 2D:
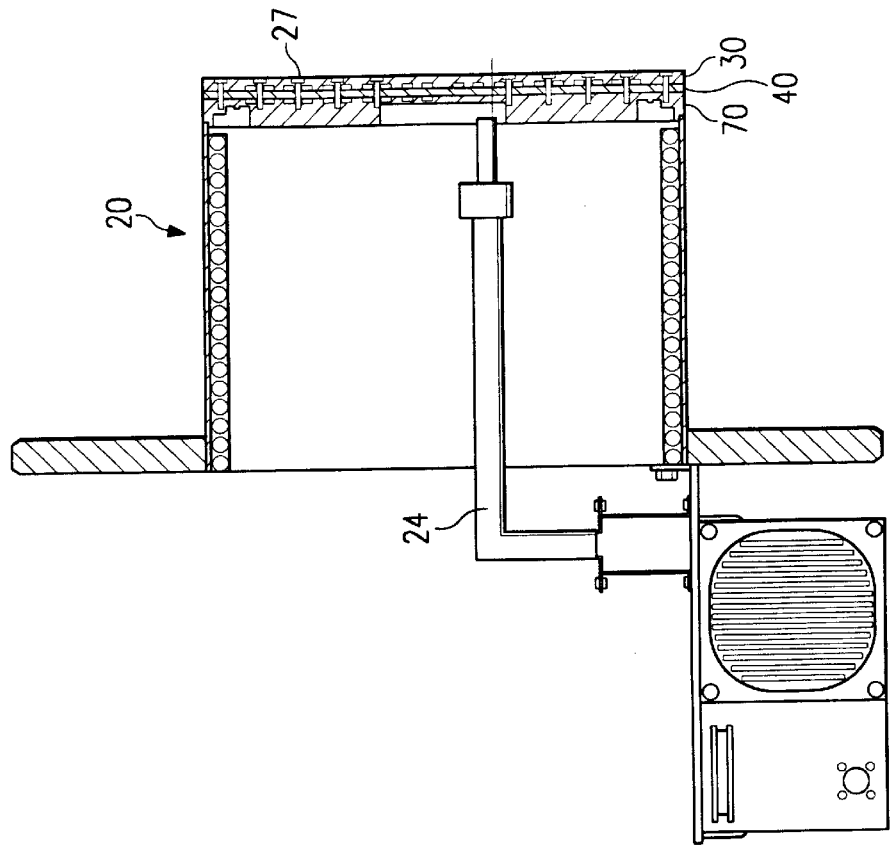
FIG. 2D illustrates a side cut-away view of the embodiment of the gas showerhead assembly of FIG. 2C.
Figure 2C:
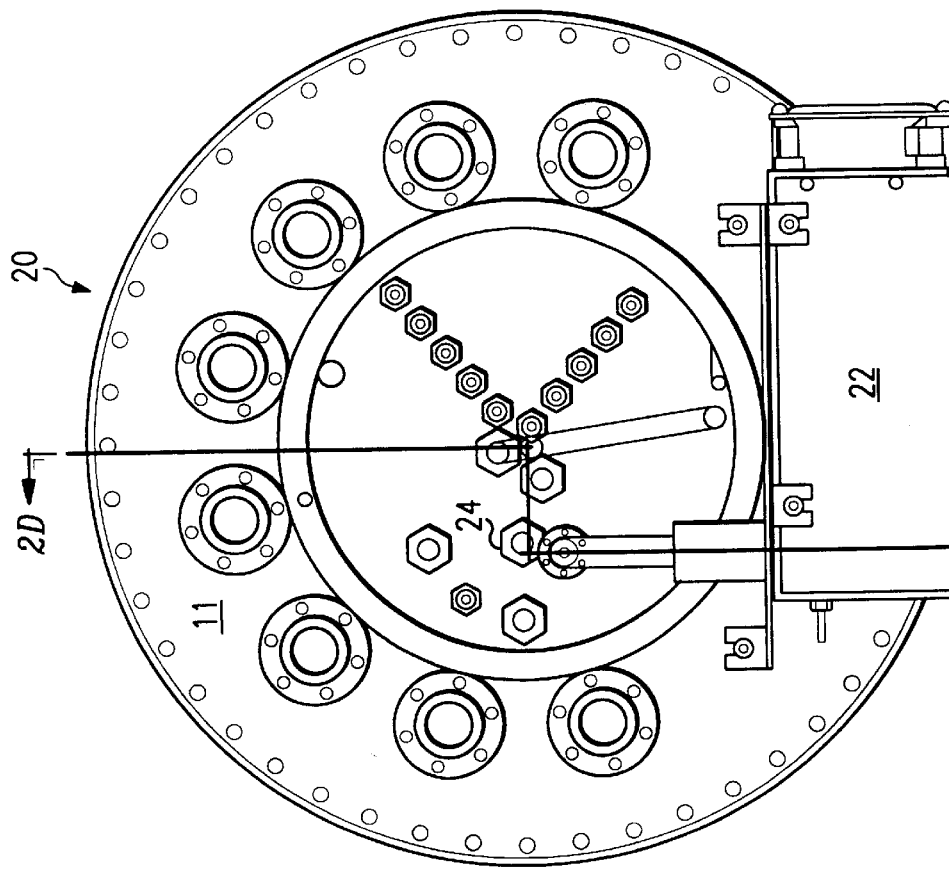
FIG. 2C illustrates a top view of an embodiment of the gas showerhead assembly including an electrical biasing apparatus for the showerhead.

FIG. 2C shows an embodiment of the showerhead assembly 20 including an optional biasing apparatus 22 coupled to electrical feedthrough 21. The biasing apparatus 22 can excite plasma in gas process manufacturing equipment 12 (in FIG. 1) for performing in-situ chamber cleaning. The biasing device 22 can comprise a radio frequency (RF), AC current or DC power supply to excite and generate in-situ plasma in processing equipment 12 (in FIG. 1). Powering gas showerhead 10 (in FIG. 1) with the biasing device 22 can produce the plasma for use in conjunction with, for example, chemical-vapor deposition to remove deposits from the process chamber 18 (in FIG. 1) walls or the gas showerhead 30 surface.

As noted, the gas showerhead of the present invention can be configured as either a biasable (FIG. 2C) or non-biasable showerhead (FIG. 2A). For applications that do not require in-situ plasma generation, showerhead injection plate 30 can couple directly to gas showerhead assembly 20 or through a metallic adaptor plate. For applications requiring plasma excitation, a ceramic insert 40 inserts between the showerhead injection plate 30 and the showerhead assembly 20 in the gas showerhead 10 structure in order to provide electrical isolation of the showerhead injection plate 30 from ground. The ceramic insert 40, for example an aluminum nitride, aluminum oxide, or boron nitride ceramic insert, provides electrical insulation between showerhead injection plate 30 (powered during plasma excitation) and grounded showerhead assembly 20 support structure (electrical ground).

For a biasable version of the gas showerhead 10 incorporating ceramic inserts 40 due to plasma generation, the showerhead injection plate 30, the ceramic insert 40 and the showerhead assembly 10 can be bonded (or brazed) together. The bonded (or brazed) version will improve the thermal contact between showerhead injection plate 30 and the showerhead assembly 20. This method of construction provides a modular biasing device 22 and ceramic insert 40 constituting a modular addition that can incorporate at a later time into existing non-biasable gas showerheads 10.

Figure 3A:
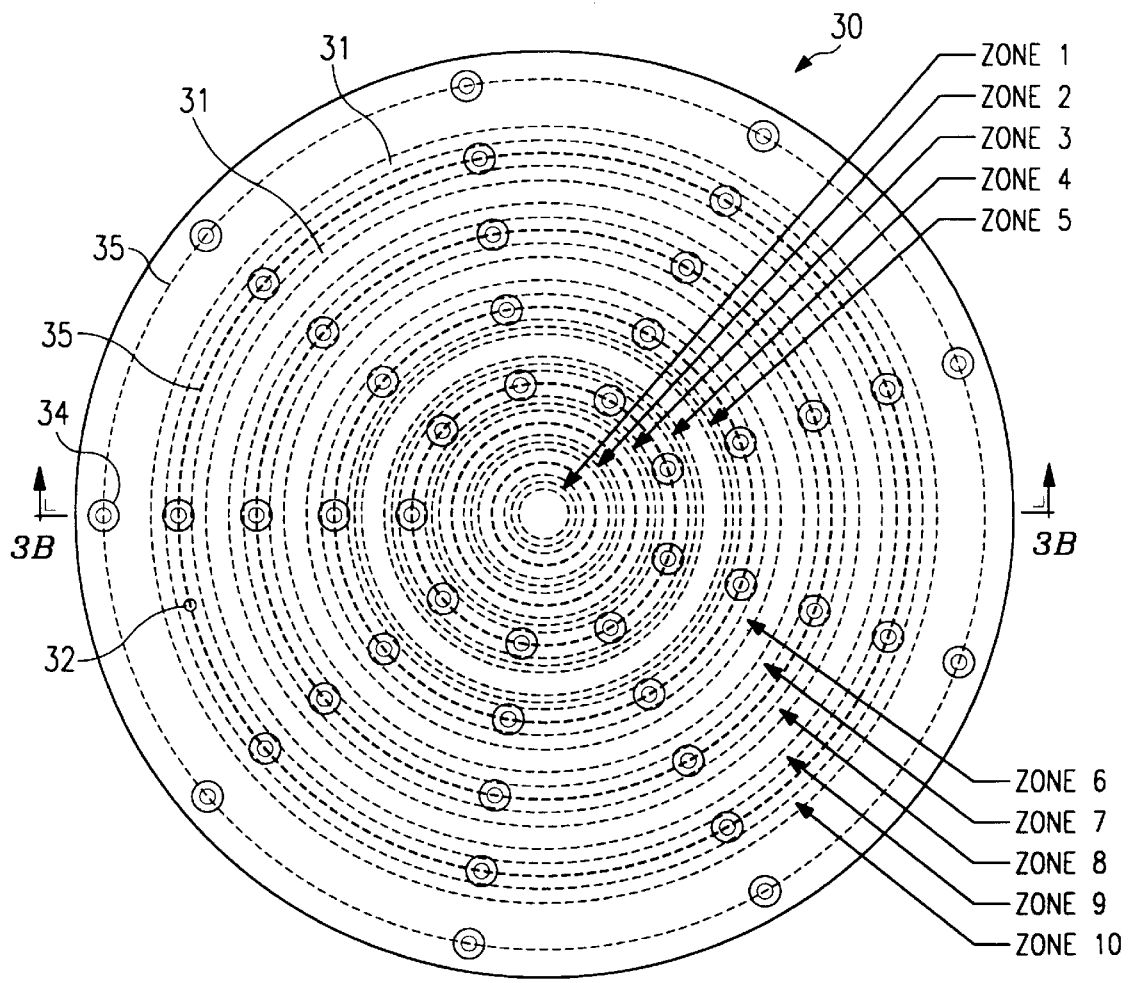
FIG. 3A illustrates a top view of an embodiment of a showerhead injection plate of the present invention.
Figure 3B:
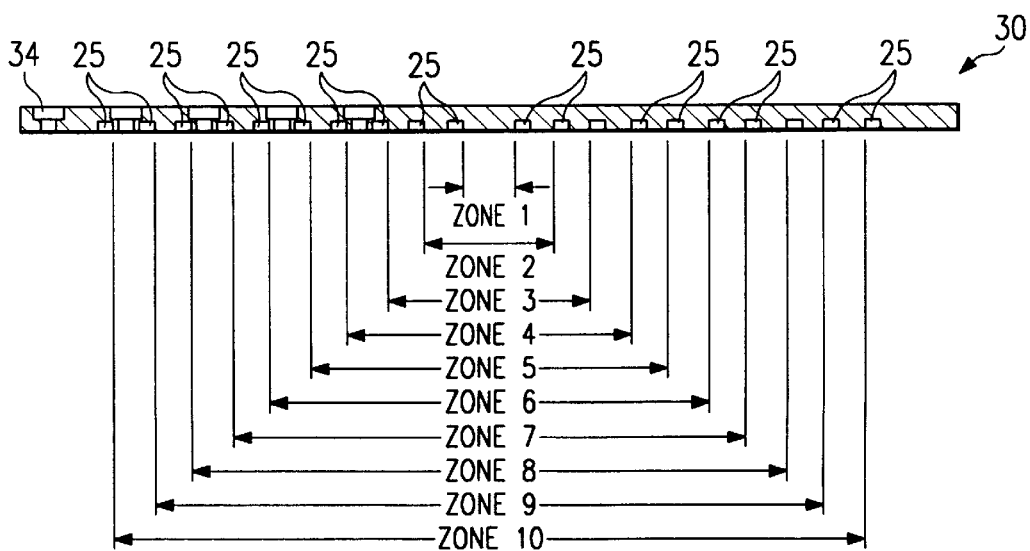
FIG. 3B illustrates a side view of the embodiment of a showerhead injection plate of FIG. 3A.

FIG. 3A shows a top view of one embodiment of showerhead injection plate 30 including ten dispersion channels 25 (shown on FIG. 3B) designed to uniformly distribute the gas flow within each of the ten injection zones (labeled on FIG. 3A as "Zones 1–10") (in the present embodiment, each injection channel forms an injection zone). Each dispersion channel 25 (FIG. 3B) contains one or more concentric dispersion rings 31 (FIG. 3A), each dispersion ring containing a plurality of injection holes 32 (only 1 shown as example in FIG. 3A) for dispensing the gas into the chamber 18 (of FIG. 1). The dispersion rings 31 are formed concentrically within showerhead injection plate 30 to allow the process gases to flow from gas tubes 24 (not shown) to injection holes. Each dispersion ring 31 has multiple injection holes 32 for injecting process gases onto the work piece (not shown). FIG. 3B shows a side view of the showerhead injection plate 30 of FIG. 3A illustrating the dispersion channels 25 of the ten zones and including the screw holes 34 for screw coupling the showerhead injection plate 30 to the insulator plate 40 (FIG. 2D) and gas showerhead assembly support structure 20 (FIG. 2D). The number, spacing, and diameter of the injection holes can be varied to optimize flow control and uniformity.

Each dispersion ring 31 contains a plurality of injection holes 32 (only 1 shown as example in FIG. 3A) approximately equidistantly spaced circumferentially around each dispersion ring 31. The injection holes appear on the bottom of the showerhead injection plate 30 such that the process gases, once passed into the dispersion channels 25 from the process gas tubes 24 (FIG. 1), can pass into the process chamber 18 (FIG. 1) via the injection holes. Injection holes 32 of the embodiment described have a diameter of approximately 0.030 inches. The current embodiment contains ten zones, ten dispersion channels, and twenty-two dispersion rings of injection holes. Zone 1 (having an inner diameter of 0.667 inches) includes 0.727 inch diameter injection ring 31 with fourteen injection holes 32, 0.857 inch diameter injection ring 31 with eighteen injection holes 32, and 0.987 inch diameter injection ring 31 with eighteen injection holes 32. Zone 2 (having an inner diameter of 1.653 inches) includes 1.713 inch diameter injection ring 31 with nineteen injection holes 32, 1.843 inch diameter injection ring 31 with twenty-three injection holes 32, and 1.973 inch diameter injection ring 31 with twenty-three injection holes 32. Zone 3 (having an inner diameter of 2.639 inches) includes 2.699 inch diameter injection ring 31 with twenty-four injection holes 32, 2.820 inch diameter injection ring 31 with twenty-eight injection holes 32, and 2.9590 inch diameter injection ring 31 with eighteen injection holes 32. Zone 4 (having an inner diameter of 3.625 inches) includes 3.685 inch diameter injection ring 341 with twenty-nine injection holes 32, 3.815 inch diameter injection ring 31 with thirty-three injection holes 32, and 3.945 inch diameter injection ring 31 with thirty-three injection holes 32. Zone 5 (having an inner diameter of 4.611 inches) includes 4.671 inch diameter injection ring 31 with thirty-four injection holes 32, 4.801 inch diameter injection ring 31 with thirty-eight injection holes 32, and 4.931 inch diameter injection ring 31 with thirty-eight injection holes 32. Zone 6, having an inner diameter of 5.597 inches, includes 5.657 inch diameter injection ring 31 and 5.917 inch diameter injection ring 31, each with fifty injection holes 32. Zone 7 (having an inner diameter of 6.583 inches) includes 6.643 inch diameter injection ring 31 and 6.903 inch diameter injection ring 31, each with fifty-five injection holes 32. Zone 8 (having an inner diameter of 7.569 inches) includes 7.759 inch diameter injection ring 31 with eighty injection holes 32. Zone 9 (having an inner diameter of 8.555 inches) includes 8.745 inch diameter injection ring 31 with eighty-five injection holes 32. Zone 10 (having an inner diameter of 9.541 inches) includes 9.731 inch diameter injection ring 31 with ninety injection holes 32. FIG. 3A also shows screw holes 34 arranged in five screw coupling rings 35 having diameters of 3.322, 5.294, 7.266, 9.238, and 11.210 inches respectively. Each of the five screw coupling rings 35 contains nine screw holes 34 spaced 40 degrees apart from each other around showerhead injection plate 30. FIG. 3A shows an example of one injection hole 32 placed in Zone 10. Showerhead injection plate 30 of FIG. 3A includes 865 injection holes 32. For gas showerhead 10 incorporating plasma generation capabilities using bonded parts, the screw holes disappear. Showerhead injection plate 30 can be constructed from stainless steel and can be plated with layers of reflective and protective coating. A highly reflective coating is highly desirable for eliminating pattern effects on temperature uniformity in RTP.

Figure 4A:
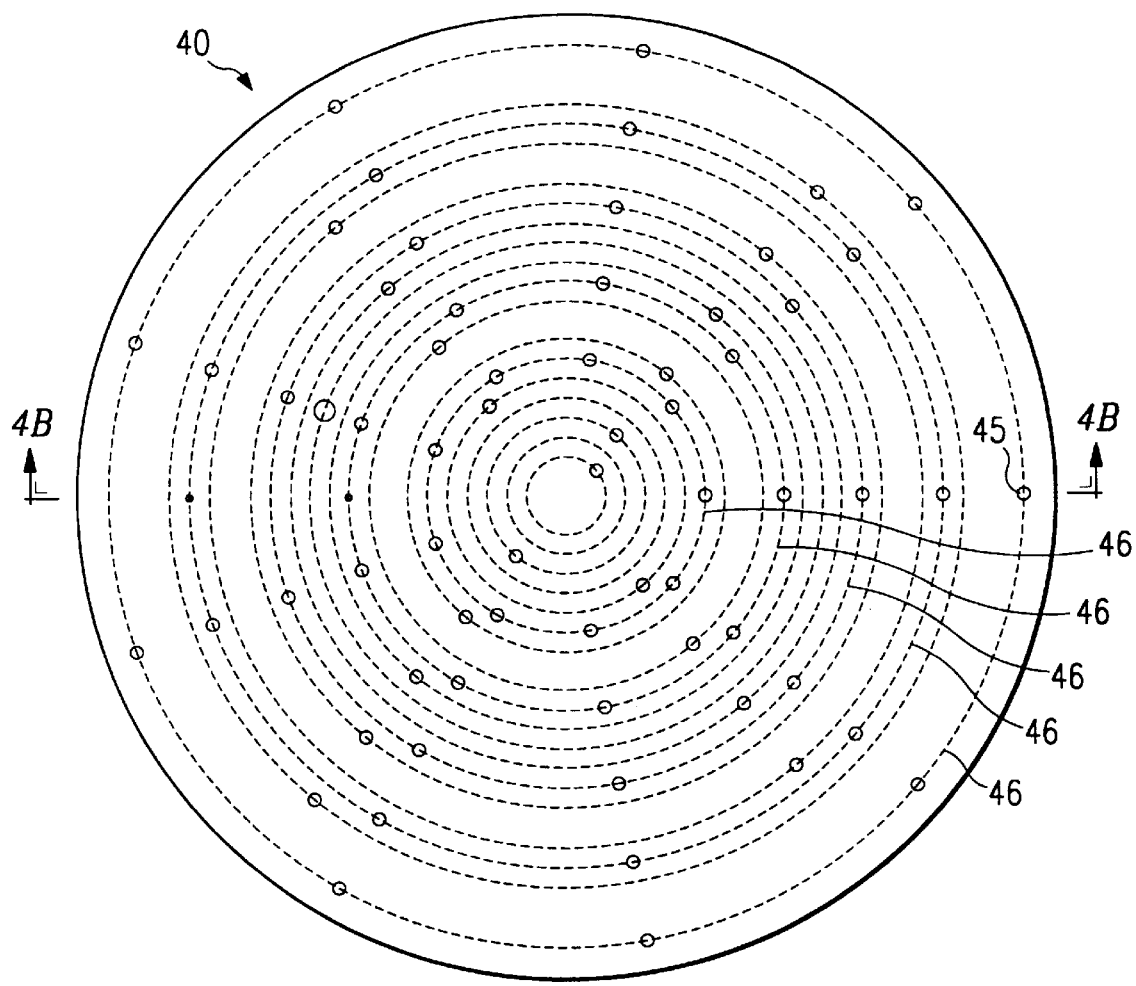
FIG. 4A shows a top view of one embodiment of the insulator plate of the present invention.

FIG. 4A shows a top view of an embodiment of insulator plate 40 that can be constructed from aluminum nitride or, alternatively, boron nitride. The embodiment of insulator plate shown in FIG. 4A includes fortyfive screw holes 45 allowing the coupling of insulator plate 40 to showerhead injection plate 30 and showerhead assembly 20 (FIG. 2D). Similarly to the showerhead injection plate 30 of FIG. 3A, insulator plate 40 of the embodiment shown in FIG. 4A has five screw coupling rings 46 having diameters of 3.322, 5.294, 7.266, 9.238, and 11.210 inches respectively. Each of the five screw coupling rings 46 contains nine screw holes 45 spaced 40 degrees apart from each other. In the bonded (or brazed) alternative embodiment of the gas showerhead 10, insulator plate 40 does not include the mounting screw holes 45, but is rather a blanket plate that bonds to showerhead injection plate 40 on one side and to showerhead assembly 20 on the other. The bonded version of insulator plate 40 includes a pass through hole (not shown) to provide electrical connection to the injection plate 30.

Figure 4B:
FIG. 4B shows a side view of the embodiment of the insulator plate of FIG. 4A.

FIG. 4B shows the side view of section 4B—4B of the insulator plate 40 of FIG. 4A. FIG. 4B shows an insulator plate 0.25 inches thick that aligns with the showerhead injection plate 30 to allow gas tubes 24 (not shown) to pass gasses into showerhead injection plate 30. Individual rings of holes are called channels, while groups of rings are called zones.

Figure 5:
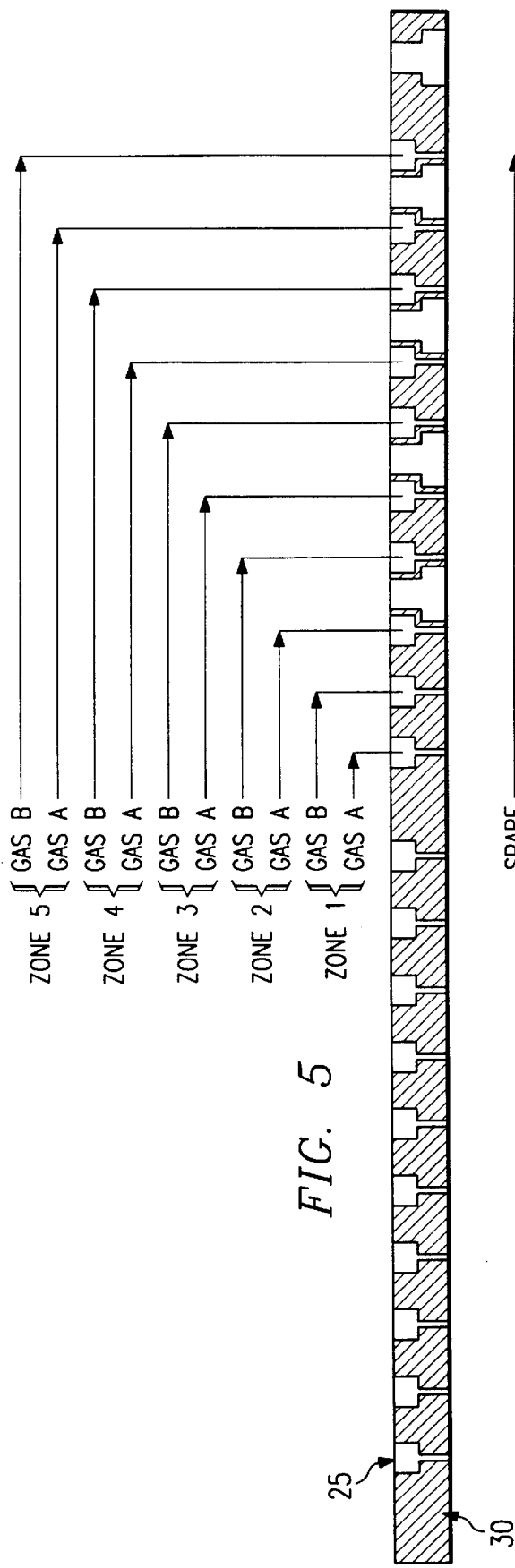
FIG. 5 illustrates one embodiment of the gas showerhead of the present invention configured for injection of two process gases.

Typical multi-gas CVD processes involve the deposition of two process gases onto the wafer surface. FIG. 5 illustrates an embodiment of the gas showerhead plate 30 of the present invention configured for the injection of two process gases. This embodiment is configured externally with 5 zones for injection of the two process gases. A configuration including five zones allows enough resolution for mass uniformity control when processing 200 millimeter silicon wafers.

The externally configurable showerhead shown in FIGS. 3A and 3B includes showerhead injection plate 30 with ten ring zones labeled zone 1 through zone 10, wherein each zone has one channel, and each channel has at least one dispersion ring. In the embodiment shown in FIG. 5, each alternating channel 25 receives either gas A or gas B so that each gas is delivered through alternating channels. This alternating injection of gas A and B into successive channels is repeated through all ten channels 25. For example, gas A would inject through channels 1, 3, 5, 7, and 9 while gas B would inject through channels 2, 4, 6, 8, and 10. In separating the gases, each pair of adjacent channels is used for injection of both A and B. By using five duplications of this process, the present invention controls radial uniformity. The particular embodiment of FIG. 5 represents a five by two configuration for injecting two process gases into five alternating groups. This configuration will provide mass transport uniformity by alternating the flow rate with zones and will eliminate gas nucleation caused by premixing the gasses prior to injection through the gas injection plate 30. This will reduce or eliminate particulate generation caused by pre-mixing the process gases resulting in a cleaner process environment and increased wafer uniformity.

While CVD gas injection processes typically involve two process gases, some CVD applications require the injection of three process gases (some examples involve more than three process gases). Thus, while the most common external configuration of the programmable showerhead would be for the injection of two process gases, the programmable showerhead 10 of the present invention provides flexibility by allowing for configurations involving the injection of more than two process gases.

The externally configurable feature of the present invention means that for a given showerhead injection plate 30 designed with n-channels, the gas showerhead 10 can be externally configured as any m-zoned showerhead 10 where $1 \leq m \leq n$. For example, if the injection plate 30 design includes 10-channels, the gas showerhead 10 can be externally configured anywhere from a 1 to 10 zone showerhead without changing the showerhead design itself. Thus, the 10 channel gas showerhead could inject one gas through all ten zones, two gases alternatively through 10 channels (each gas through five zones), three gasses alternatively through 10 channels (two gasses through 3 zones and one gas through 4 zones), and so forth.

The design of the gas showerhead provides axis-symmetric injection from ten zones. The relative cross-sectional areas of the dispersion channel and the injection holes are designed to provide a much larger gas flow conductance in the dispersion channel than in the injection hole. Some of the important applications for an axis-symmetric ten zone showerhead in the CVD area include in-situ doped and undoped polysilicon, amorphous silicon, epitaxially grown silicon and silicon germanium. Other important applications include selective epitaxial growth, silicon dioxide, silicon nitride, phosphorous silicate glass (PSG), borosilicate glass (BSG) and borophosphorous silicate glass (BPSG). The present invention can also be used in a variety of metal depositions such as tungsten, and also metal organic CVD applications such as copper, titanium, titanium nitride, aluminum and others.

Figure 6:
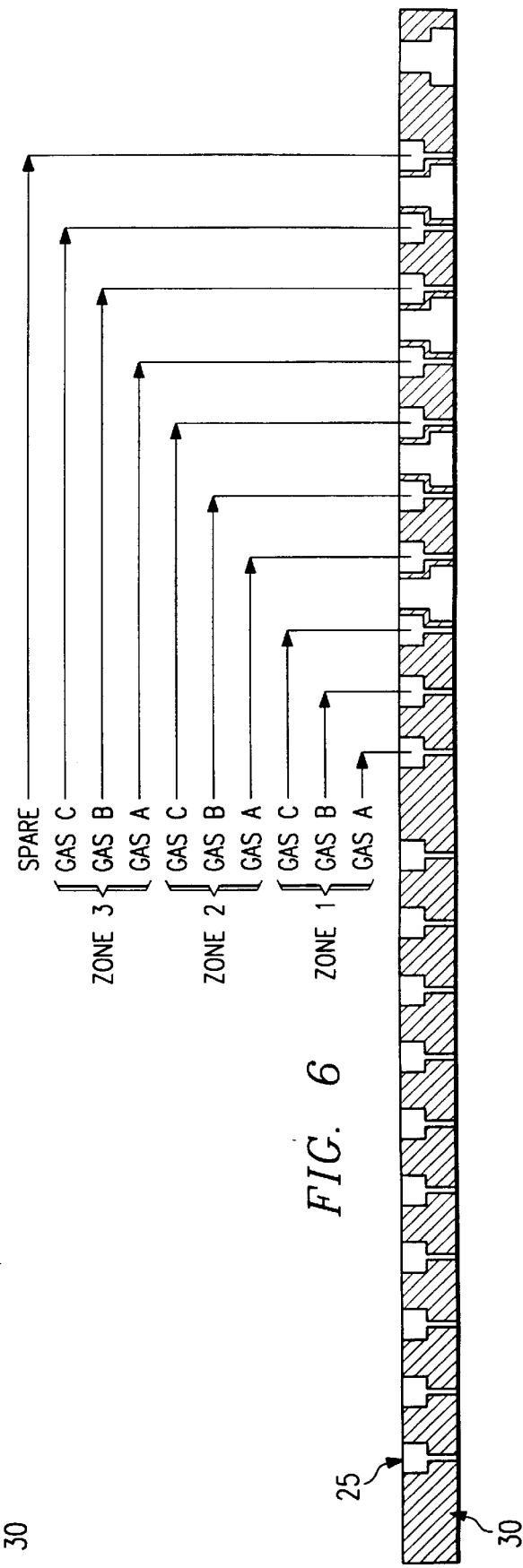
FIG. 6 illustrates one embodiment of the gas showerhead of the present invention configured for injection of three process gases.

FIG. 6 illustrates the flexible external configurability of the present invention. FIG. 6 shows another embodiment of the gas showerhead configured to inject three process gases.

In operation, the multi-zone configurations of the present invention can control multiple process gases in a manner that avoids premixing of the process gases to greatly reduce gaseous nucleation in the process chamber. Rather than premixing the multiple process gases prior to injection through the injection plate, the gas showerhead 10 of the present invention sends the unmixed process gases separately through gas tubes 24 to alternating injection channels 25 contained within showerhead injection plate 30, where one or more injection channels 25 can be grouped together and called a "zone". The process gases are then injected through injection rings 31 (also referred to as "dispersion rings") out into the process chamber where mixing occurs over the wafer 14 for deposition onto the wafer 14. The present invention can control the flow of each process gas individually through one or more injection zones. The present invention does not require pre-mixing the process gases prior to injecting through the various injection zones. The multiple zone injection method allows the mixing of the process gases within the process chamber and avoids gas-phase nucleation caused by premixing the process gases. The multi-zone control of the process gases (avoiding premixing) also allows multi-zone control of the gas and/or vapor flow uniformity profile for improved process uniformity.

The gas showerhead 10 of the present invention can also include monitoring devices to provide real-time monitoring of the gas and/or vapor flow uniformity to provide real-time process uniformity control. Temperature sensor ports 29 can also be used to accommodate other sensors to monitor the process state, the wafer state, or both. The process state and/or wafer state sensors can couple to a computer system to automatically monitor the gas/vapor flow uniformity, other process state, and wafer uniformity.

The present invention can also provide thermal control of the gas showerhead 10 to control temperature over a relatively wide range (from below room temperature to greater than 300 degrees Celsius). FIG. 7A shows one embodiment of circular cooling plate 70 that includes eighteen groove formations 75 in fluid communication with inner channel 73 in further fluid communication with outer channel 71. As shown in the embodiment represented by FIG. 7A, outer channel 71, formed circularly within the outer wall of cooling plate 70, is approximately 0.50 inches wide and communicates through 18 equally spaced (approximately 20 degrees apart) approximately 0.25 inch openings 79 with inner channel 73. Inner channel 73 also follows the circular contour of cooling plate 70 and is approximately 0.25 inches wide. Outer channel 71 allows the flow of cooling fluid around the outer circumferential portion of cooling plate 70. The coolant then flows through openings 79 to inner channel 73, and further to groove formations 75 that flow the coolant towards the center of cooling plate 70. The eighteen groove formations 75 each occupy approximately ten degrees of the cooling plate 70 surface. The ten degree pattern groove formations 75 are rotated about the center of cooling plate 70 and equally spaced apart (approximately 20 degrees each). The groove formations 75, as shown in FIG. 7C, include two flow grooves 770 formed between approximately triangular notches 72 and spacers 74. Each flow groove 770 can be approximately 0.25 inches wide to allow the flow of a cooling fluid from the inner channel 73 to the center of cooling plate 70, as shown in FIG. 7B.

Cooling plate 70 can provide temperature control through either a closed loop recirculating chiller or a heat exchanger to control the temperature of gas showerhead 10 in a range from less than room temperature up to greater than 300° C. Outer channels 71, inner channels 73, and flow grooves 770 fabricated within the cooling plate 70 flow a coolant or a heating fluid through the cooling plate 70. Because cooling plate 70 directly contacts gas showerhead assembly 20, fabricating the channels and grooves into cooling plate 70 provides improved thermal contact between showerhead injection plate 30 and showerhead assembly 20. This configuration allows more precise temperature control on showerhead injection plate 30.

The present invention can also integrate various process and equipment state sensors and actuators to allow the present invention programmable capabilities, as shown in FIG. 1. The thermocouple sensor port 29 can be adapted to work with other sensors and activators. These sensing capabilities can include sensing devices to detect when to perform a showerhead and process chamber cleaning. These sensing capabilities can also include temperature sensors to control gas showerhead temperature. The gas showerhead can also include optical viewports to incorporate additional sensors to monitor the process state and wafer state. All of these sensing devices can couple to an externally controlled computer, or other control device, to automatically sense temperature, cleanliness, process state and wafer state. This programmable capability allows more automated control of the CVD process.

A specific embodiment of embedded sensors and actuators involves actuated thermocouple probes within the gas showerhead to monitor temperature state of both the process chamber and of the wafer. These sensors and actuators can be integrated into the gas showerhead apparatus as shown in FIGS. 1 and 2.

For RTP applications, the showerhead of the present invention can include a highly reflective, optically reflective surface 90 (shown in FIG. 2B) facing the front side of the wafer in order to eliminate the effects of device patterns on wafer temperature uniformity. This highly reflective surface 90 forms an optical cavity with the wafer and renders the effective emissivity of the wafer surface close to one, regardless of the actual emissivity.

In summary, the present invention provides a programmable gas showerhead for delivering one or more process products (gases or vapors) to a work piece in microelectronic manufacturing equipment. The present invention employs a multi-zone gas showerhead capable of depositing multiple process gases through a plurality of injection zones onto the work piece (for example, wafers used for microelectronics device fabrication). The gas showerhead separates the multiple process gases in a process gas delivery system that includes multiple injection rings to avoid premixing process gases, thereby minimizing gas-phase nucleation and particulate generation within the process chamber. The present invention includes external configurability that allows for configuring the present invention to provide injection from 1 to N zones. This multi-zone showerhead provides a significant advantage because it can separate multiple process gases and/or vapors through the gas/vapor delivery system without premixing the gases/vapors. Since premixing of multiple process gases/vapors is avoided, the multi-zone injection (showerhead) of this invention minimizes the possibility of gas-phase nucleation (and particulate generation) and provides greater uniformity of deposition.

Although the present invention has been described in detail, it should be understood that various changes, substitutions and alterations can be made hereto without departing from the spirit and scope of the invention as defined by the appended claims.

What is claimed is:

1. A multi-zone injection apparatus for delivering a plurality of process gases into a chamber for processing a work piece in microelectronic manufacturing equipment, comprising:
   an injection plate, the injection plate operable to receive the plurality of process gases and to deliver the plurality of process gases into the chamber, comprising:
      a plurality of injection holes formed within the injection plate; and
      a plurality of injection channels formed within the injection plate in fluid communication with the injection holes wherein each process gas flows through at least one channel within the injection plate to avoid premixing the plurality of process gases prior to delivery into the chamber; and
   a temperature control plate located proximate the injection plate, wherein the temperature control plate operates to control the temperature of the injection plate.

2. The apparatus of claim 1, further comprising an insulator plate coupled between the injection plate and the temperature control plate and wherein the injection plate couples directly to the insulator plate.

3. The apparatus of claim 1, wherein the injection plate is circular and the plurality of injection holes formed therein allow delivery of the plurality of process gases from the injection channels to the chamber, and further wherein the plurality of injection channels form a plurality of concentric rings with varying diameters within the injection plate, and further wherein at least one injection zone comprises at least two injection channels wherein each injection channel within each zone receives a different gas.

4. The apparatus of claim 3, further comprising:
   an insulator plate coupled between the injection plate and the temperature control plate, the insulator plate operable to allow the process gases to flow through to the injection plate.

5. The apparatus of claim 4, wherein the injection plate, the insulator plate and the temperature control plate form a structure that separates a processing region of the chamber from a non-processing region.

6. The apparatus of claim 5, wherein the injection plate further comprises n injection zones, where n is an integer value greater than or equal to two and is configurable to inject the plurality of process gases through a total of m injection zones where m is an integer from 1 to n.

7. The apparatus of claim 5, wherein the plurality of injection holes are grouped into radially and circumferentially spaced dispersion rings, and further wherein each injection channel is in fluid communication with at least one dispersion ring such that a process gas flowed through the injection plate by a particular injection channel enters the chamber through the at least one dispersion ring in fluid connection with that particular injection channel.

8. The apparatus of claim 7, wherein the injection plate comprises ten injection channels and wherein the first, a second, a third, a fourth, and a fifth injection channels are in fluid communication with three dispersion rings per injection channel, a sixth and a seventh injection channels are in fluid connection with two dispersion rings per injection channel, and an eighth, a ninth and a tenth injection channels are in fluid connection with one dispersion ring per injection channel, and further wherein the gas showerhead is configured for ten injection zones.

9. The apparatus of claim 7, wherein the plurality of injection channels have successively increasing diameters beginning with a first injection channel.

10. The apparatus of claim 4, wherein the temperature control device comprises a cooling and/or heating medium operable to control the temperature within the showerhead assembly over a temperature range from approximately 10 degrees Celsius to greater than approximately 300 degrees Celsius.

11. The apparatus of claim 10, wherein the temperature control device further comprised a closed loop recirculating chiller coupled to the cooling and/or heating medium.

12. The apparatus of claim 10, wherein the temperature control device further comprises a heat exchanger coupled to the cooling and/or heating medium.

13. The apparatus of claim 10, wherein the cooling and/or heating medium further comprises channels to flow a fluid to control temperature.

14. The apparatus of claim 4, further comprising at least one embedded process state sensor to monitor a process state of the apparatus.

15. The apparatus of claim 14, further comprising a computer coupled to the at least one process state sensor, the computer programmable to monitor a process state through the process state sensor and automatically generate control signals to alter the process state according to an algorithm contained within the computer.

16. The apparatus of claim 4, further comprising at least one work piece sensor to monitor a state of the work piece.

17. The apparatus of claim 16, further comprising a computer coupled to the at least one work piece sensor, the computer programmable to monitor a work piece state through the work piece state sensor and automatically send out control signals to alter the process state according to a program contained within the computer.

18. The apparatus of claim 16, further comprising:
a plurality of thermocouple probes embedded within the showerhead assembly; and
a plurality of actuators coupled to the plurality of thermocouple probes, wherein the actuated thermocouple probes are operable to move closer to and further away from the work piece to monitor the work piece temperature.

19. The apparatus of claim 18, wherein the plurality of actuated thermocouple probes are contained within a controlled medium in the process chamber.

20. The apparatus of claim 4, further comprising a reflective surface facing a front side of the work piece in order to eliminate the effects of device patterns on wafer temperature uniformity during rapid thermal processing.

21. The apparatus of claim 3, wherein the apparatus is configured for delivering a first process gas and a second process gas and further wherein the apparatus delivers the first process gas to alternating injection zones of the injection plate, and delivers a second process gas to the remaining injection zones, thereby delivering the two process gases into the chamber through alternating injection zones of the injection plate in order to separate the process gases and to achieve mass transport deposition uniformity.

22. The apparatus of claim 21, wherein the plurality of injection zones comprises a first, a second, a third, a fourth, and a fifth successively spaced injection zones, wherein the first process gas is injected through the first, third, and fifth injection zones, and the second process gas is injected through the second and fourth injection zones.

23. The apparatus claim 3, wherein the apparatus is configured to deliver three process gases into the chamber, and further wherein the apparatus delivers each process gas to alternating injection zones, thereby depositing the three process gases into the chamber through alternating injection zones of the injection plate in order to separate the gases and to increase mass transport deposition uniformity.

24. The apparatus of claim 3, further comprising in-situ process sensors and wafer state sensors embedded in the apparatus.

25. The apparatus of claim 3, wherein the plurality of injection zones comprises ten injection zones.

26. The apparatus of claim 3, further comprising:
a biasing device coupled to the injection plate operable to generate plasma.

27. The apparatus of claim 26, wherein the biasing device is further operable to generate plasma for in-situ cleaning of injection plate and chamber, the chamber being a process chamber.

28. The apparatus of claim 27, wherein the biasing device further comprises an RF source.

29. The apparatus of claim 28, further comprising:
a biasing sensor for sensing when to generate in-situ plasma; and
a computer coupled to the biasing sensor, the computer programmable to provide sensor based monitoring of the injection plate and chamber states to make an automated decision when to perform an in-situ plasma cleaning.

30. The apparatus of claim 27, wherein the biasing device further comprises a DC source.

31. The apparatus of claim 27, wherein the biasing device further comprises an AC source.

32. The apparatus of claim 1 further comprising a plurality of channels within the temperature control plate to provide heating or cooling to the injection plate during operation.

33. The apparatus of claim 1, wherein the microelectronic manufacturing equipment is rapid thermal processing equipment.

34. The apparatus of claim 1, wherein the microelectronic manufacturing equipment is rapid thermal chemical vapor deposition equipment.

35. The apparatus of claim 1, wherein the microelectronic manufacturing equipment is metal-organic chemical vapor deposition equipment.

36. The apparatus of claim 1, wherein the microelectronic manufacturing equipment is plasma-enhanced chemical vapor deposition equipment.

37. The apparatus of claim 1 further comprising embedded temperature sensors for in-situ measurement of said work piece temperature.

38. The apparatus of claim 1, wherein the work piece is a semiconductor wafer.

39. The apparatus of claim 1, wherein the work piece is a flat panel display device.

40. A multi-zone injection apparatus for delivering a plurality of process gases into a chamber for processing a work piece in microelectronic manufacturing equipment, comprising:
a showerhead assembly separating a process environment region of the chamber from a non-processing region operable to deliver a plurality of process gases for processing the work piece, comprising;
a showerhead assembly support structure;
an injection plate coupled to the showerhead assembly support structure operable to receive the plurality of process gases and to deliver the plurality of process gases into the chamber, comprising;
a plurality of injection channels formed within the injection plate and circumferentially spaced around the injection plate to form a plurality of concentric rings with varying diameters within the injection plate, wherein each of the plurality of process gases can be flowed through the injection plate such that each injection channel contains a single process gas thereby minimizing gas-phase nucleation and particulate generation by avoiding prefixing the plurality of process gases prior to delivery into the chamber; and a plurality of dispersion rings comprising groups of radially and circumferentially spaced injection holes formed within the injection plate to allow delivery of the plurality of process gases from the injection plate to the chamber wherein each injection channel is in fluid communication with at least one dispersion ring such that each process gas flowed through the injection plate within a particular injection channel enters the chamber through the at least one dispersion ring that is in fluid communication with that particular injection channel; and a temperature control plate located proximate the injection plate and coupled to the showerhead assembly support structure.

41. The apparatus of claim 40, further comprising:

an insulator plate coupled between the injection plate and the temperature control plate, wherein the plurality of process gases first flows through the temperature control plate to the insulator plate and upon exiting the insulator plate, enter the injection plate.

42. The apparatus of claim 41, wherein the injection plate further comprises n gas injection zones, wherein each injection zone contains at least one injection channel, and wherein n is an integer value greater than or equal to two, and wherein the showerhead assembly is configurable for up to m injection zones where m is any number of zones from 1 to n.

* * * * *